United States Patent [19]

Stuart et al.

[11] 3,890,581

[45] June 17, 1975

[54] DIGITAL FM (FSK) MODULATOR

[75] Inventors: Richard L. Stuart; Arvind M. Bhopale, both of Beltsville; Paul E. Treynor, New Carrollton, all of Md.

[73] Assignee: Rixon Inc., Silver Spring, Md.

[22] Filed: Dec. 27, 1972

[21] Appl. No.: 318,750

[52] U.S. Cl. .................. 332/11 R; 178/66; 325/163

[51] Int. Cl. .................. H04l 27/12

[58] Field of Search ........ 332/9 R, 9 T, 11 R, 11 D; 325/163; 178/66 R

[56] References Cited

UNITED STATES PATENTS

| | | | |
|---|---|---|---|
| 3,548,320 | 12/1970 | Roberts et al. | 332/9 R X |
| 3,621,403 | 11/1971 | Seiy | 332/9 R X |
| 3,713,017 | 1/1973 | Vena | 332/9 R |
| 3,761,625 | 9/1973 | Bruene | 332/9 R X |

*Primary Examiner*—Alfred L. Brody
*Attorney, Agent, or Firm*—Larson, Taylor & Hinds

[57] ABSTRACT

A digital FM (FSK) modulator is provided which includes a programmable counter the frequency output of which varies in accordance with the data input so that the frequency is $F_0$ for a logical "0" and $F_1$ for a "1". A shaping circuit detects any change in the state of the incoming data and initiates a predetermined variable duty cycle digital output sequence responsive thereto. The programmable counter includes a modulating counter which changes its count with the output sequence so as to provide a gradual transition between the previous and new frequencies, and fixed counters which smooth out the relatively rapid frequency changes dictated by the output sequence. A sinewave generator converts the output of the programmable counter into a step approximated sinusoidal waveform corresponding to the frequency $F_0$ or $F_1$.

9 Claims, 21 Drawing Figures

FIGURE I

DIGITAL FM (FSK) MODULATOR

FIELD OF THE INVENTION

The present invention relates to a digital FM (FSK) modulator for generating a band limited frequency modulated signal.

BACKGROUND OF THE INVENTION

Conventional FM modulators employ analog filters to produce a band limited FM signal. Band limiting, of course, permits putting two digital signals close to one another on the same line using adjacent frequency spectrums. In accordance with one common form of FM modulator, a voltage controlled oscillator is used to produce one or the other of two frequencies in accordance with the data input, i.e., depending on whether, for example, the data input corresponds to a logical 1 or 0. Band limiting can be provided by filtering the output of the oscillator using an analog bandpass filter or, alternatively, by appropriately filtering or shaping the data input to reduce the band width. Perhaps the most important disadvantage of this approach is the high cost as compared with digital techniques which enable the use of relatively inexpensive large scale integrated circuits.

SUMMARY OF THE INVENTION

In accordance with the invention, a digital FM (FSK) modulator is provided wherein the necessary filtering to produce a band limited signal occurs in the modulation process so that analog filters are not required. The modulator of the invention enables implementation with large scale integrated circuits at substantially reduced cost as compared with analog modulator and filter circuits.

Generally speaking, the invention involves producing a frequency modulated signal by changing the divide ratio of a digital frequency divider in accordance with the data input so that, for example, a first frequency is generated for a 0 and a second frequency is generated for a 1. The modulator of the invention senses when there is a change in the state of the data, e.g., wherein the data changes from a 0 to 1 or vice versa, and responsive to such a change, generates a variable duty cycle transition sequence which provides a smooth transition between the frequency corresponding to the previous data state and that corresponding to the new data state. To explain, the modulator includes a clock controlled digital shaping circuit which upon sensing a change in the state of the data provides output sequence which gradually varies in duty cycle during a transition period. A modulating counter which changes the count thereof in accordance with the output sequence of the shaping circuit provides a gradual frequency variation between the previous modulation frequency and the new modulation frequency. Fixed counters following the modulating counter smooth the relatively rapid frequency changes dictated by the output sequence so as to produce a smooth transitional frequency versus time curve, preferably of raised sinewave form. The output of the counters is converted into a step approximated sinusoidal waveform corresponding to the modulating frequency ($F_0$ or $F_1$) by a sinewave generator.

Other features and advantages of the invention will be set forth in or apparent from the detailed description of a preferred embodiment found hereinbelow.

BRIEF DESCRIPTION OF THE DRAWINGS

FIG. 1 is a block diagram of a digital FM (FSK) modulator in accordance with the invention;

DESCRIPTION OF A PREFERRED EMBODIMENT

Figure 2A:
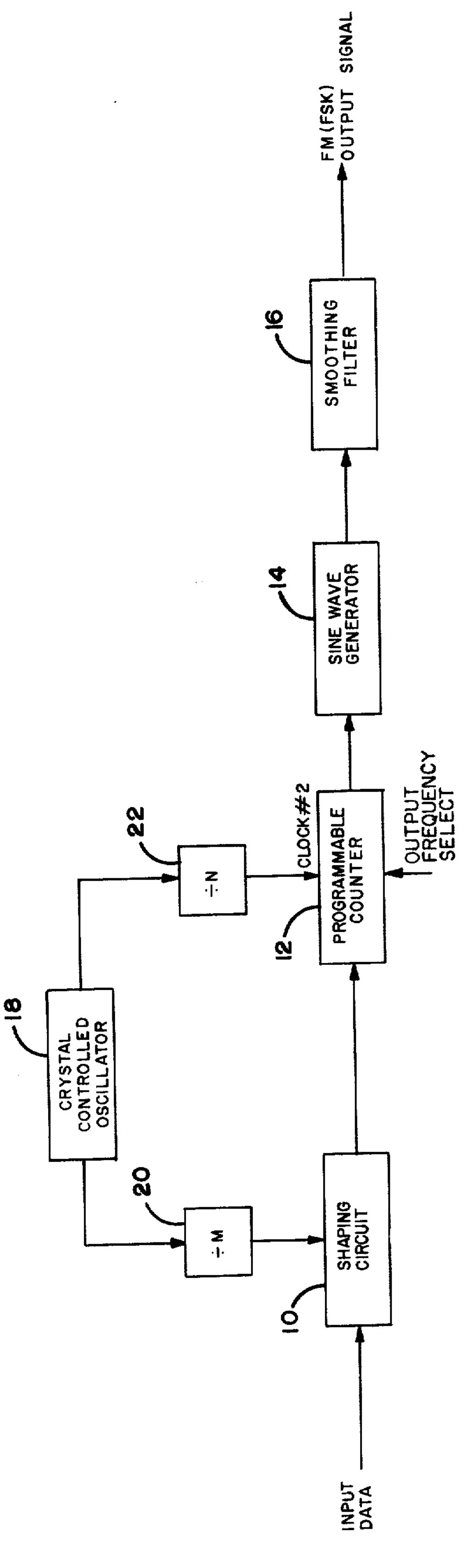
FIGS. 2(*a*) and 2(*b*) are digital output sequence waveforms utilized in the modulator of FIG. 1.

Before considering the details of specific embodiment, the modulator of the invention will first be considered in general terms. Referring to FIG. 1, a block diagram of the modulator of the invention is shown. The modulator includes a shaping circuit 10 connected to receive the data input signal, a programmable counter 12, a sinewave generator 14 and a smoothing filter 16 connected to the output of sinewave generator 14. A clock generator in the form of a crystal controlled oscillator 18 produces an output which is divided by M in a first frequency divider 20 and is divided by N in a second frequency divider 22. The output of divider 20 forms the clock, denoted "clock No. 1", for the shaping circuit 10 whereas the output of divider 22 forms the clock, denoted "clock No. 2", for programmable counter 12. The division ratios of dividers 20 and 22 are selected so that if the output of the shaping circuit 10 is a logical 1, the output of programmable counter 12 is a square wave of frequency $F_1$ Hz and, similarly, if the output of shaping circuit 10 is a logical 0 then the output of programmable counter 12 is a square wave of frequency $F_0$ Hz. As is explained in more detail below, programmable counter 12 comprises a modulating counter, which changes count with the data input, and a plurality of fixed counters.

Programmable counter 12 includes an "output frequency select" input which is described below in connection with FIG. 6.

Figure 2B:
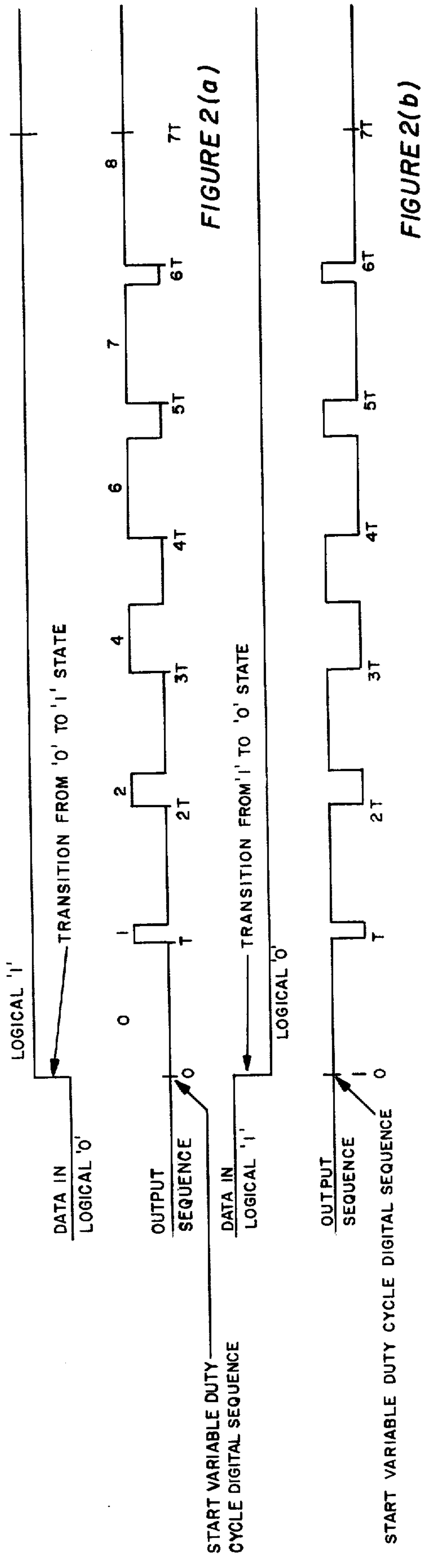

In general, the invention involves producing a frequency modulated signal by changing the divide ratio of a digital frequency divider by the data signal. As explained hereinbelow, a predetermined wave form such as shown in FIGS. 2(*a*) and 2(*b*) is employed, although other wave forms can be applied to the modulating counter of programmable counter 12 for this purpose. The frequency modulated signal is a two level signal in which $F_1$ Hz corresponds to a logical 1 of the data and $F_0$ Hz corresponds to a logical 0 as set forth. Assuming that the input data comprises a series of logical 1's so that the frequency modulated signal has a frequency of $F_1$ Hz, if the data is switched to a logical 0 the output of shaping circuit 10 follows a transition sequence described below to enable smooth switching of frequency $F_1$Hz to $F_0$Hz. The output of programmable counter 12 is converted by sinewave generator 14 into a step approximated sinusoidal wave form having a corresponding frequency $F_0$ or $F_1$ Hz. Filter 16 converts the approximated sinusoidal wave form to a smooth sinusoid.

Figure 3:
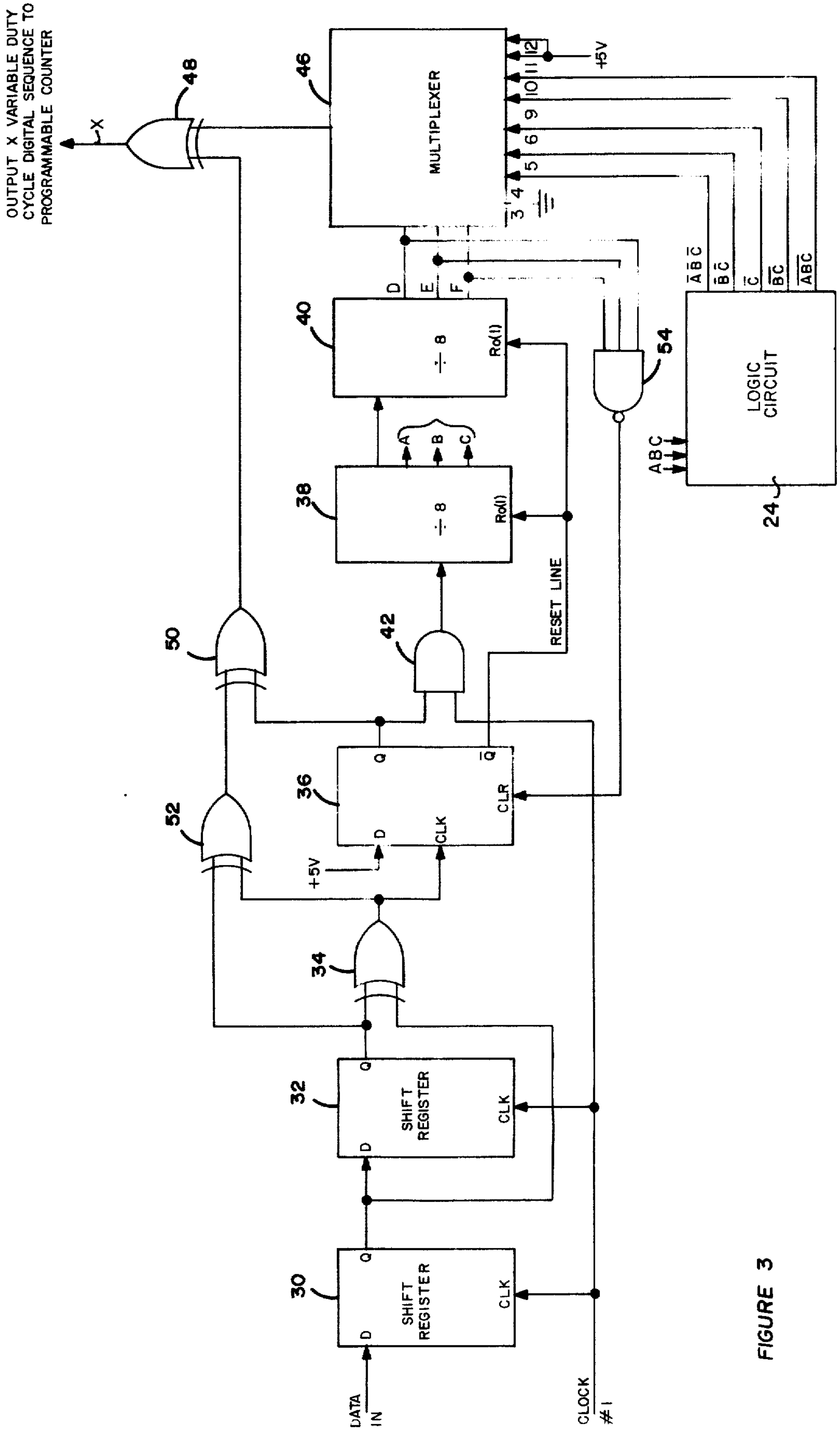
FIG. 3 is a circuit diagram of the shaping circuit of FIG. 1.
Figure 4:
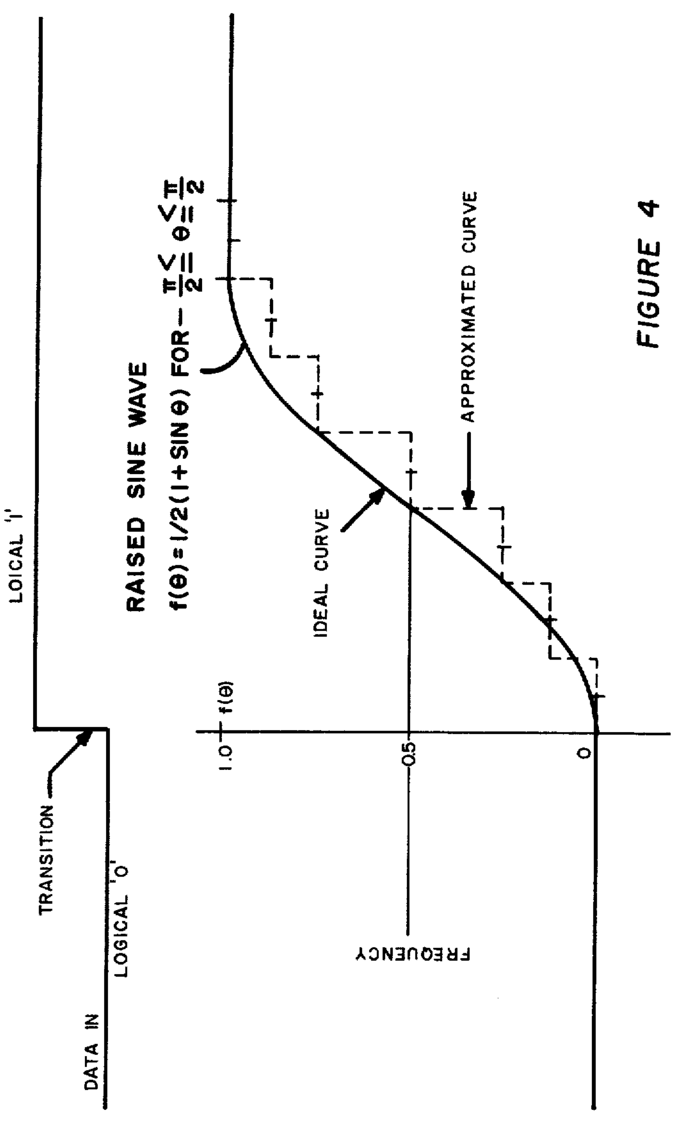
FIG. 4 is a frequency versus time diagram showing ideal and approximated curves for 0 to 1 logic transition.

Considering the details of the basic blocks referred to above, FIG. 3 is a circuit diagram of the shaping circuit 10 of FIG. 1. It should be emphasized that the circuit of FIG. 3 merely represents one possible embodiment of the shaping circuit, and that the shaping circuit can be implemented in other ways. The purpose of shaping circuit 10 is to detect any change of state in the incoming data and to initiate, responsive to detecting such a change in state, a predetermined variable duty cycle digital output sequence at a given rate. A presently preferred form of this digital output sequence is shown in FIGS. 2(*a*) and 2(*b*) for 0 to 1 and 1 to 0 transitions, respectively, as indicated. For example, in FIG. 2(*a*) the transition period is divided up into seven sub-periods which are in turn divided up into eight units. As illustrated, the duty cycle for each sub-period varies progressively between zero units for the sub-period O to T to a full 8 units (100%) for the sub-period 6T to 7T. In the example under consideration it takes 56 clock pulses to generate the variable duty cycle sequence which approximates a part of the raised sine wave shown in FIG. 4. As indicated in FIG. 4, the raised sine wave to be approximated is of the form $f(\theta) = \frac{1}{2}(1 + \sin\theta)$ for $-\pi/2 \leq \theta \leq \pi/2$.

Referring again to FIG. 3, the input data is read into two shift registers 30 and 32 in series using clock No. 1. Typical requirements for clock No. 1 and clock No. 2 are shown in the following table.

| MODE OF OPERATION | CLOCK NO. 1 HZ | CLOCK NO. 2 HZ | X LEVEL |
|---|---|---|---|
| | | | 0 |
| A | | 633.6K | 1 |
| | | | 0 |
| B | 40.84K | 816.8K | 1 |
| | | | 0 |
| C | 35.62K | 712.4K | 1 |
| | | | 0 |
| B* | 28.8K | 288.0K | 1 |

| MODE OF OPERATION | SELECT DIVIDE RATIO LINES A13 P1 | P2 | P3 | P4 | ÷ | A14 P1 | P2 | P3 | P4 | ÷ | FO HZ | F1 HZ |
|---|---|---|---|---|---|---|---|---|---|---|---|---|
| | 0 | 0 | 1 | 0 | 6 | | | | | | 2200 | |
| A | 1 | 1 | 0 | 1 | 11 | 1 | 1 | 0 | 0 | 3 | | 1200 |
| | 0 | 1 | 1 | 0 | 10 | | | | | | 1276 | |
| B | 1 | 0 | 1 | 0 | 12 | 1 | 0 | 0 | 0 | 4 | | 1064 |
| | 0 | 1 | 1 | 0 | 10 | | | | | | 2226 | |
| C | 1 | 1 | 0 | 1 | 11 | 1 | 1 | 1 | 0 | 2 | | 2023 |
| | 0 | 1 | 1 | 0 | 10 | | | | | | 450 | |
| B* | 1 | 0 | 1 | 0 | 12 | 1 | 0 | 0 | 0 | 4 | | 375 |

The outputs of registers 30 and 32 are respectively connected to the inputs of an exclusive OR-gate 34 which is used to sense any change in state in the incoming data. The output of exclusive OR-gate 34 is connected to a flip-flop 36 and a change of state sensed by gate 34 will cause triggering flip-flop 36 to thereby cause the $\overline{Q}$ output to change from 1 to 0. The $\overline{Q}$ output of flip-flop 36 is connected to the reset line inputs of first and second frequency dividers 38 and 40. An AND gate 42 has one input connected to the $\overline{Q}$ output of flip-flop 36 and the other connected to the clock No. 1 input. The output of gate 42 is connected to the input of frequency divider 38 and with a change of state in the incoming data so that $\overline{Q}$ output of flip-flop 36 is 0, the clock No. 1 signal is connected to the input of divider 38. With the $\overline{Q}$ output of flip-flop 36, and hence the reset line, at 1, all of the outputs of dividers 38 and 40 are at 0.

Figures 5A, 5B, 5C, 5D, 5E, 5F, 5G, 5H, 5I, 5J, 5K:
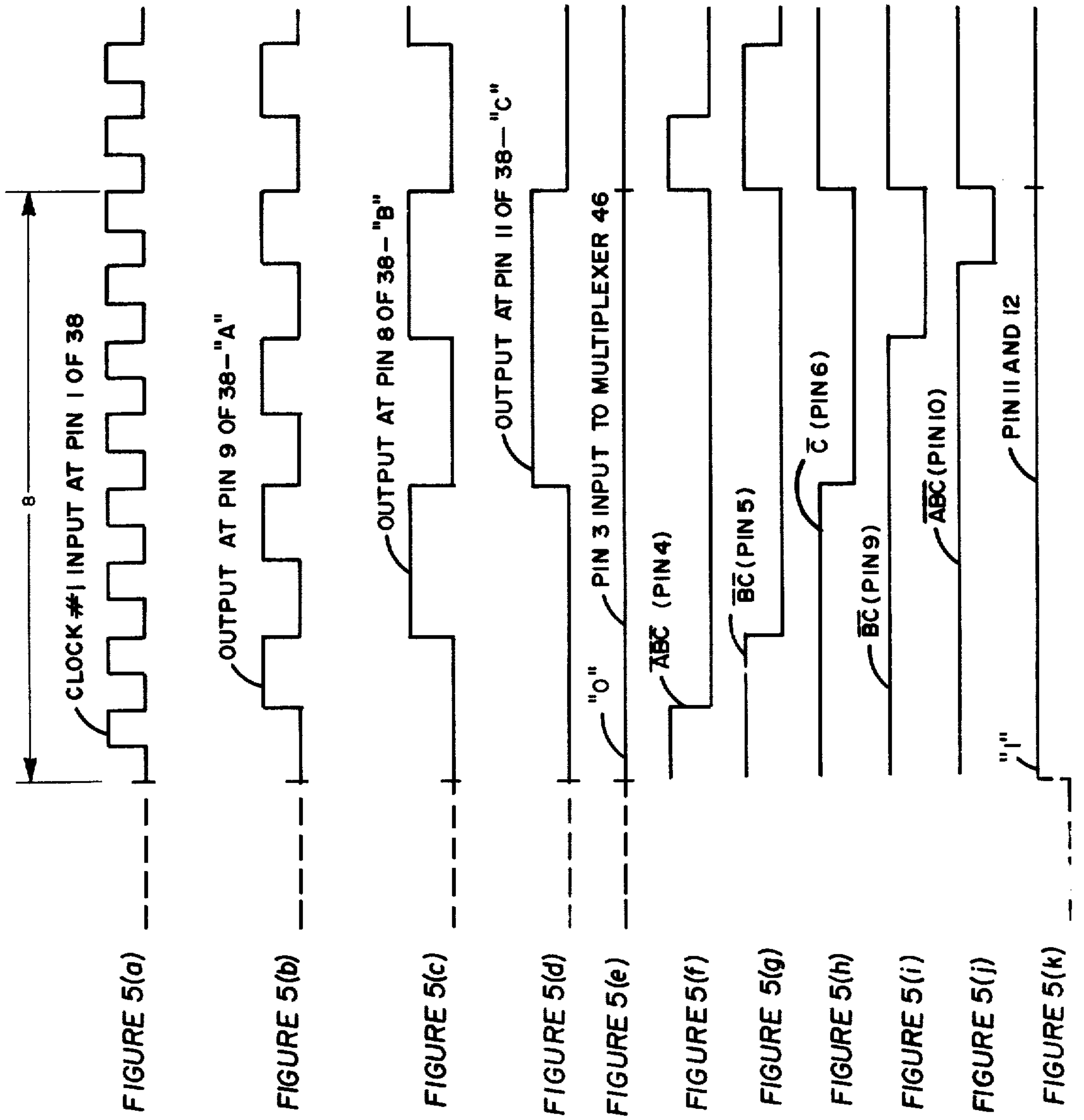
FIGS. 5(*a*) to 5(*k*) are voltage waveforms for various points in the shaping circuit of FIG. 4.

The outputs of divider 38, which are denoted A, B and C and shown in FIGS. 5(*b*) to 5(*d*) are logically combined by a logic circuit 24 to produce five inputs to an eight-input miltiplexer 46. The logical relationships between the outputs and inputs and a corresponding timing diagram are shown in FIGS. 5(a) to 5(k). For example, as illustrated, the $\overline{ABC}$ input to pin 4 of multiplexer 46 is a 1 when all of the outputs A,B,C, are 0. The remaining three inputs to eight-input multiplexer 46 are 0 at grounded pin 3 and 1 at pins 11 and 12 which are connected to a +5V supply. The output of second divider 40, which are denoted F, E and D are connected to the "select" lines or inputs of multiplexer 46.

The output of multiplexer 46 forms one input a further exclusive OR-gate 48. The second input is formed by the output of a further exclusive OR-gate 50 having inputs respectively connected to the Q output of flip-flop 36 and the output of yet another exclusive OR-gate 52. The inputs to exclusive OR-gate 52 are connected to the output of register 32 and the output of exclusive OR-gate 34 so that the output of gate 52 is the same as that of the first register 30 and indicates whether the change of state in incoming data is from 0 to 1 or from 1 to 0. The Q output of flip-flop 36 remains at 1 as long as the counters (dividers) 38 and 40 are operating in the count enable mode described above. If the data is at 1, the output of exclusive OR-gate 50 remains at 1 except for the duration when the output of flip-flop 36 is at pin Q. Similarly, if the data is at 0 then the output of gate 50 stays at 0 except for the duration when the output of flip-flop 36 is at pin Q. The output, X, of exclusive OR-gate 48 is the desired variable duty cycle digital output sequence shown in FIG. 2(*a*) or FIG. 2(*b*) depending on the transition. A NAND gate 54 is connected to the outputs, F, E and D, of divider 40 and when all of these outputs reach 1, flip-flop 36 is cleared so that Q is set at 0 and $\overline{Q}$ at 1.

Figure 6:
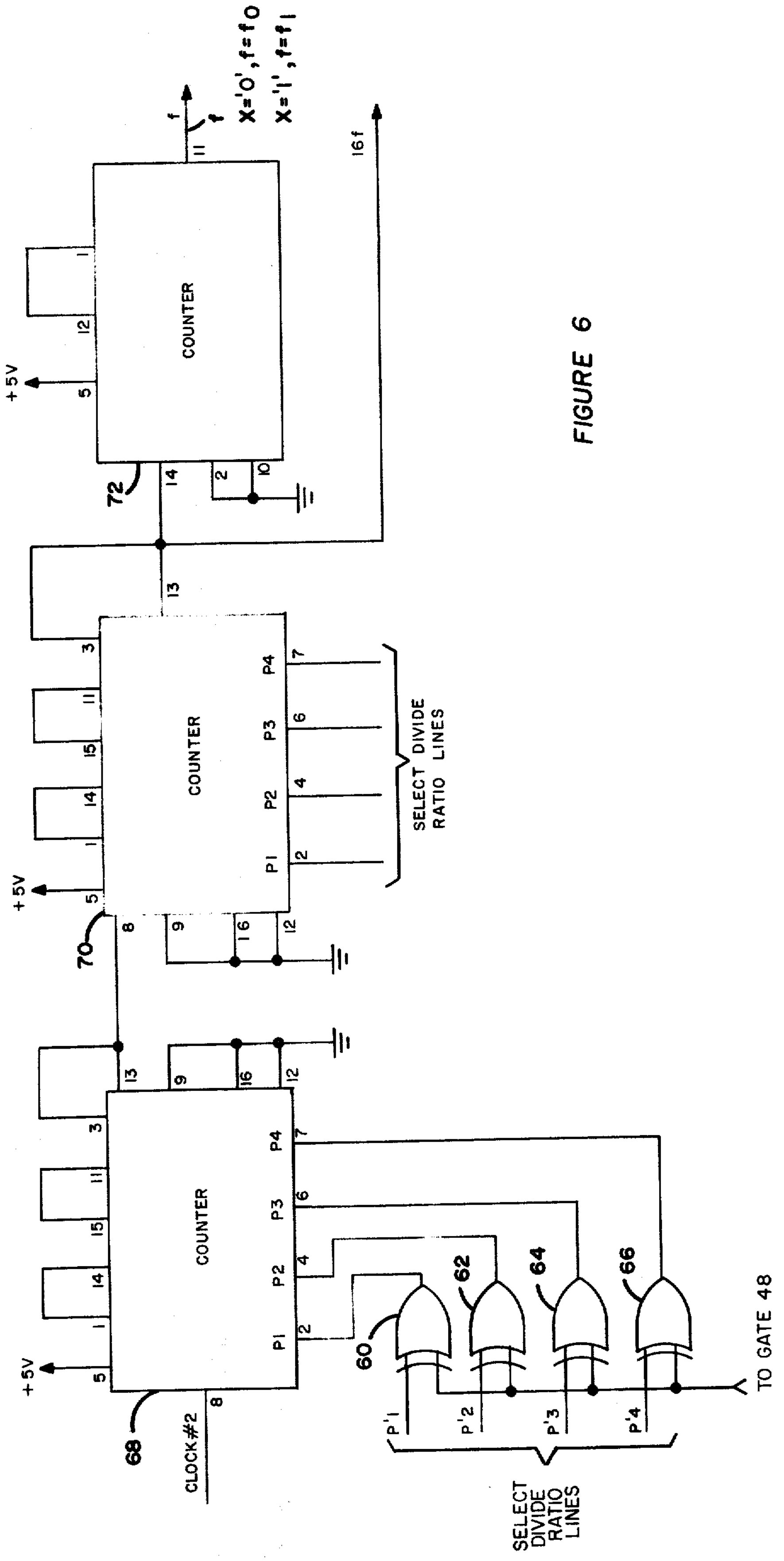
FIG. 6 is a circuit diagram of the programmable counter of FIG. 1.

Referring to FIG. 6, the circuit diagram of one embodiment of the programmable counter 12 of FIG. 1 is shown. The counter includes four exclusive OR-gates 60, 62, 64 and 66 each of which has one input connected to the output, X, of exclusive OR-gate 48 of shaping circuit 10 and one input connected to one of the "select divide ratio" lines P'1, P'2, P'3 and P'4. The outputs of gates 60, 62, 64 and 66 are connected to P1 to P4 inputs of a first counter 68 which is also connected to clock No. 2 signal. The output of counter 68 is connected to one input of a further counter 70 which is also connected to further select divide ratio lines as indicated. A further counter 72 is connected to the output of counter 70 and produces an output $f$, with $f = f_0$ for X = 0 and $f = f_1$ for X = 1 as indicated. As mentioned above, the FM (FSK) modulator can be operated at various speeds by selecting proper division ratios for counters 68 and 70 and by changing clock No. 2. The necessary controls for several speeds are shown in the table above.

Figure 7:
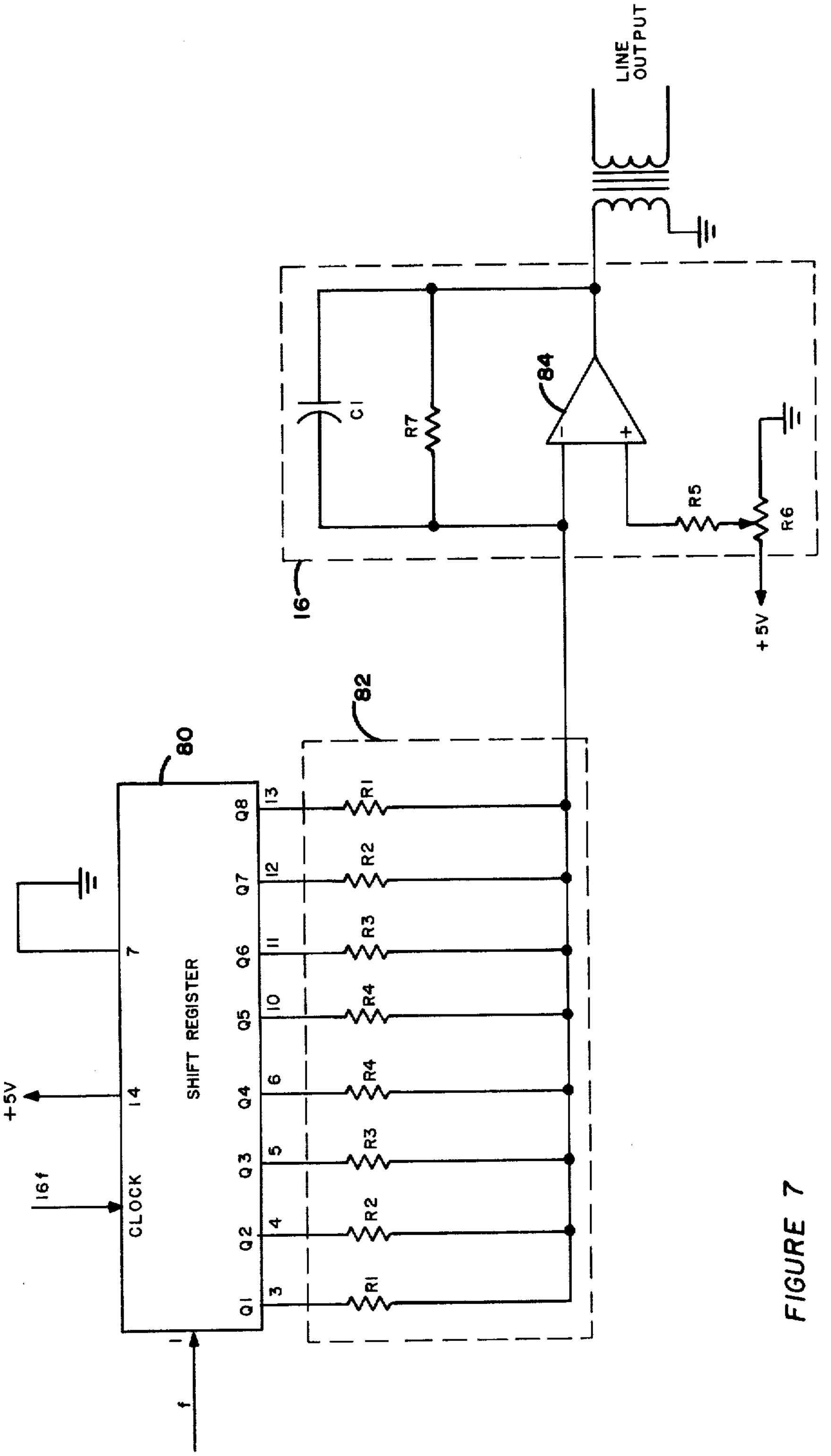
FIG. 7 is a circuit diagram of the sinewave generator of FIG. 1.

Referring to FIG. 7, a circuit diagram of one embodiment of the sinewave generator 14 of FIG. 1 is shown. A sinewave generator of this type was described in commonly assigned application Ser. No. 269,047, entitled "Digital SSB Transmitter" and filed on July 5, 1972. The input to the sinewave generator is, as stated, formed by the output of programmable counter 12 of FIG. 1 and, more particularly, the output of counter 72 of FIG. 6, which is a square wave of frequency fHz. This square wave input is connected to the input of an 8-bit, series in, parallel out, shift register 80 while the output of counter 70, which is 16fHz, is connected to the clock input. A resistor ladder network 82 is connected to the outputs of shift register 80. The resistors of the ladder network 82 suitably weight the individual outputs of register 80 to produce a step approximated sinewave of frequency fHz. In a specific embodiment, resistors R1 = 216K, resistors R2 = 93.1K, resistors R3 = 61.9K and resistors R4 = 52 K. The output of resistor ladder network 82 is connected to one input of an operational amplifier 84 which forms part of the smoothing filter 16 of FIG. 1. Filter 16 also includes a capacitor C1 and a resistor R7 which are connected back from the output of operational amplifier 84 to the input mentioned above, the other input of amplifier 84 being connected to the tap of a potentiometer R6 through a resistor R5 as shown.

Figure 8:
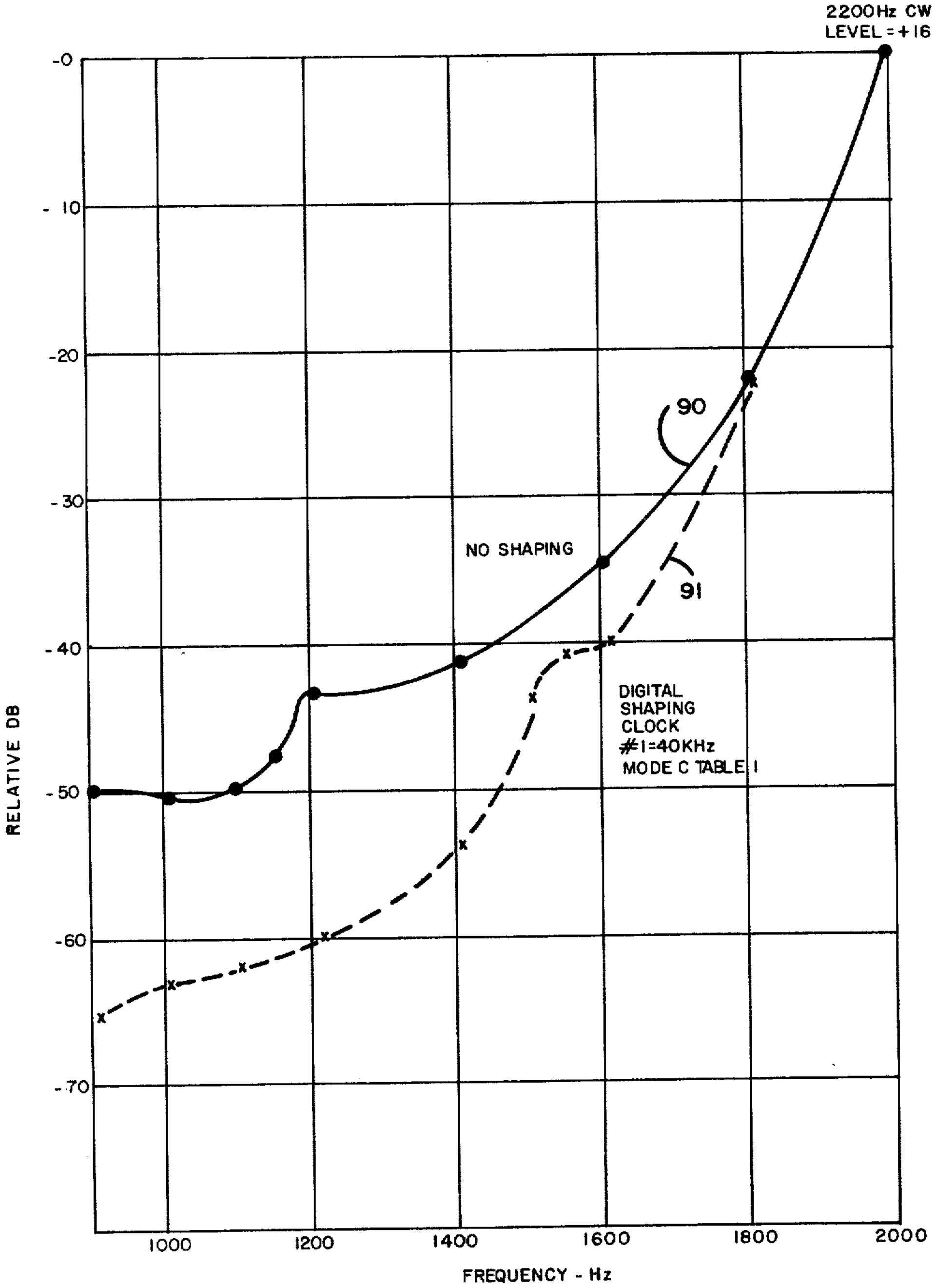
FIGS. 8 to 10 are curves illustrating the operation of the modulator of the invention.
Figure 9:
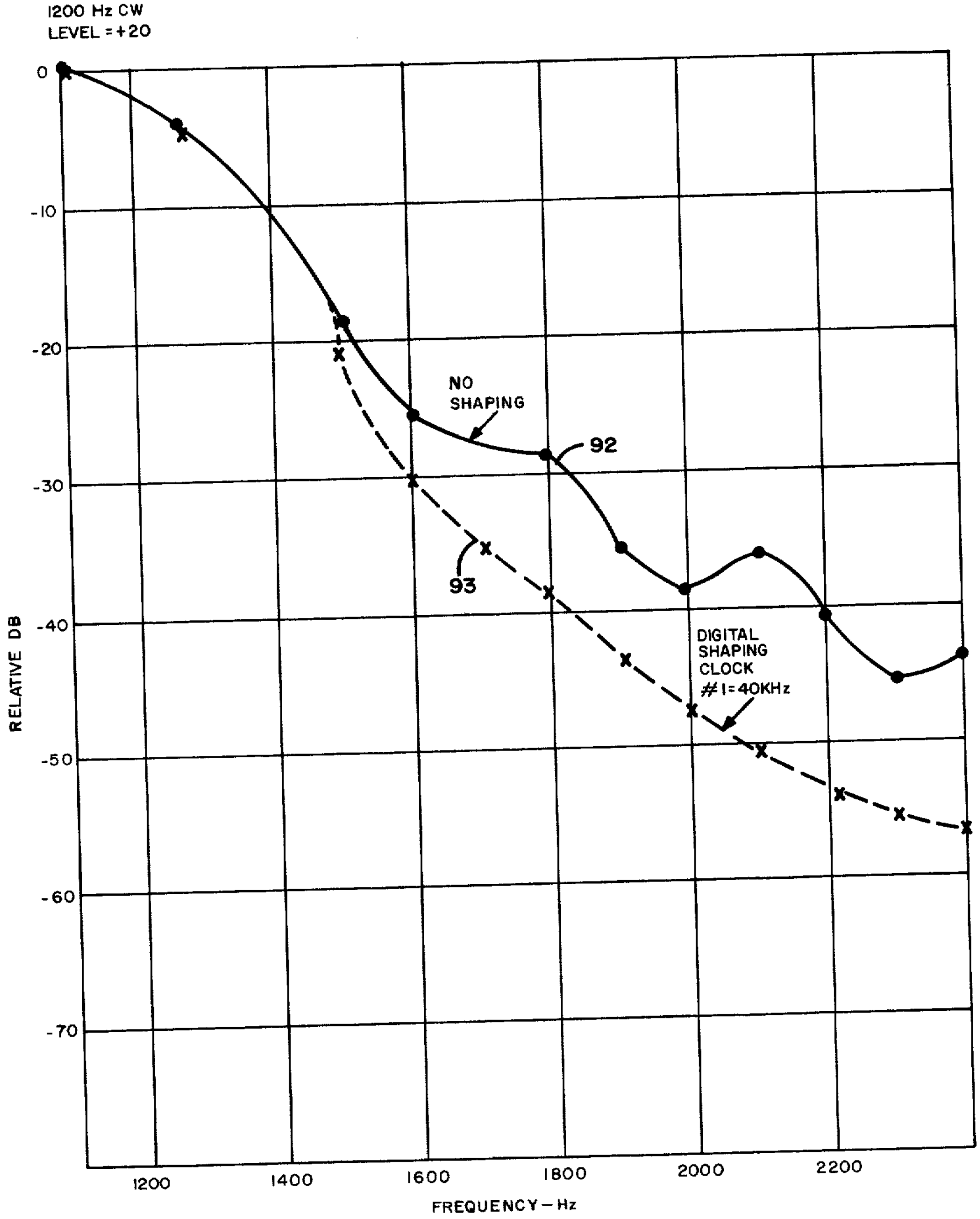
Figure 10:
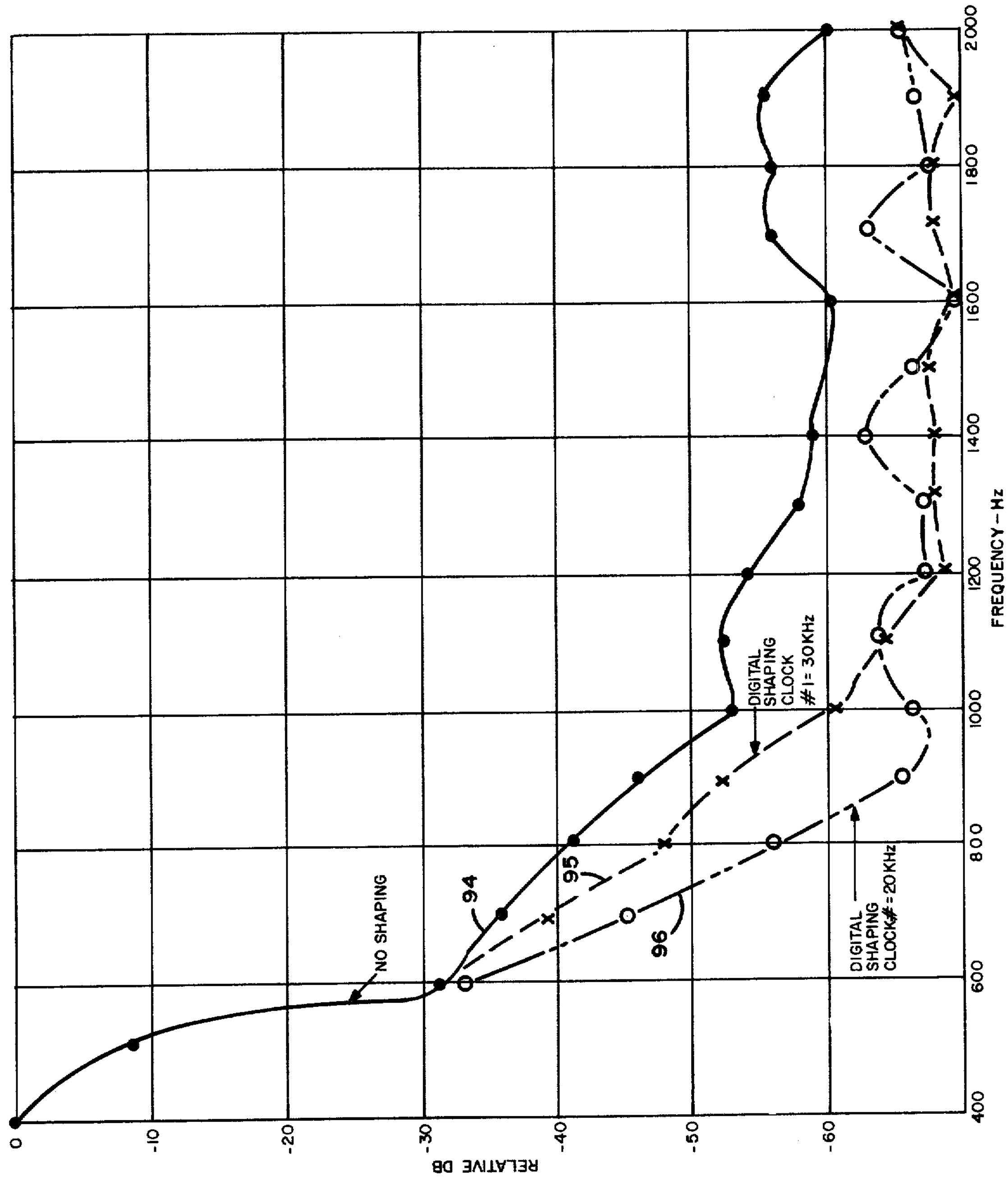

The spectral characteristics of the digital frequency modulator are illustrated in FIGS. 8, 9 and 10. Referring to FIG. 8, the lower spectrum is shown of a transmitter operated in "mode C" of Table I above. The chain line curve, denoted 90, represents the measured spectrum with no digital shaping, that is, with the input to line X of FIG. 6 being the incoming data, not the "output sequence" of FIGS. 2(*a*) or 2(*b*). The dotted curve 91 represents the spectrum with digital shaping. It is evident from FIG. 8 that in the region of 1,000 to 1,200 Hz the spectral level has been reduced by 10db meaning that a signal in this region will receive 10db less interference. It should be noted that the digital shaping provided by the invention does not affect the wave form of the desired demodulated signal.

FIG. 9 shows the effect of digital shaping on the upper spectrum of an FM transmitter operated in "Mode B" of Table I. The chain line curve 92 represents the measured spectrum without shaping whereas the dashed line curve 93 represents the spectrum with shaping. Again, as is evident from FIG. 9, the results are similar to that discussed above, with shaping providing substantial improvement regarding interference.

Referring to FIG. 10, the effect of digital shaping on the upper spectrum of an FM transmitter is shown, the transmitter operating in mode B* of the table. FIG. 10 shows curves, namely curves 95 and 96, for two different clock No. 1 frequencies. It will be seen that a 20 kHz clock (curve 96) causes the spectrum to fall rapidly so that the level is approximately 67db at 950 Hz. However, as illustrated, the spectrum oscillates up to about 62db and then down again in a recurring pattern through the 1,000 to 2,000 Hz range. Thus, the shaping provided could be optimum if minimum interference to a tone at 950 Hz is desired. However, if minimum interference to a signal over the range of 1,000 to 2,000 Hz is desired, curve 95, corresponding to a frequency 30 kHz for clock No. 1, is to be preferred. With a 30 kHz clock, as shown, the spectrum does not fall as rapidly but does not rise above about −65db in the range of 1,120 to 2,000 Hz. Both curves 95 and 96, of course, compare favorably with curve 94 which corresponds to operation without shaping.

Although the invention has been described relative to an exemplary embodiment thereof, it will be understood by those skilled in the art that variations and modifications can be effected in this embodiment without departing from the scope and spirit of the invention.

We claim:

1. A digital FM (FSK) modulator comprising means for generating a clocking signal, variable frequency divider means connected to receive said clocking signal and providing division thereof at a rate which varies in accordance with the data input to the modulator so as to produce a first frequency output responsive to a first data state and a second frequency output responsive to a second data state, and shaping circuit means, connected to receive the data input and including logic circuit means, for sensing when the data changes state and for producing a predetermined variable duty cycle digital output sequency responsive thereto, said variable frequency divider means including counter means connected to the output of said shaping circuit means, the frequency output of said counter means varying in accordance with said digital output sequence so as to provide a gradual change in the frequency of the modulator between the frequency corresponding to the previous data state and the frequency corresponding to the new data state during a predetermined transition period.

2. A digital FM modulator as claimed in claim 1 further comprising fixed counter means connected to the output of the first mentioned counter means for smoothing out rapid changes in frequency dictated by said output sequence.

3. A digital FM modulator as claimed in claim 2 wherein said shaping circuit means provides a said output sequence having a duty cycle which gradually varies over the transition period so as to produce a modulator frequency versus time characteristic which approximates a raised sinewave.

4. A digital FM modulator as claimed in claim 1 further comprising sinewave generator means connected to the output of said frequency divider means for converting the output of said frequency divider means into a step approximated sinusoidal wave form of corresponding frequency.

5. A digital FM modulator as claimed in claim 4 wherein said sinewave generator comprises a multistage serial in, parallel out shift register and a ladder network connected to the outputs of the register for weighting the outputs of the individual registers to form said step approximated sinusoidal wave form.

6. A digital FM modulator as claimed in claim 1 wherein said clocking signal generating means comprises oscillator means for generating a clock signal of predetermined frequency, first divider means for dividing the clock frequency by a first factor, and second divider means for dividing the clock frequency by a second factor, said modulator further comprising means for connecting the output of said first divider means to an input of said shaping circuit means, and means for connecting the output of said second divider means to an input of said counter means, the division ratio being selected such that if the output of said shaping circuit means is a logical 0 the output of said counter means is a square wave of said first frequency and if the output of said shaping circuit means is a logical 1 the output of said programmable counter means is a square wave of said second frequency.

7. A digital FM modulator as claimed in claim 6 wherein said means for sensing a change in state of the incoming data comprises first and second shift registers controlled by the output of said first divider means and connected in series so that the incoming data is read serially thereinto and is read out in parallel, and an exclusive OR-gate connected to the output of each of said first and second registers, said shaping circuit means further comprising further counter means and a flip-flop connected to the output of said exclusive OR-gate for controlling the connection of the output of said first divider means to the input of said further counter means.

8. A digital FM modulator as claimed in claim 7 further comprising a multiplexer and logical control means for converting the output of said counter means into a series of inputs to said multiplexer.

9. A digital FM modulator as claimed in claim 2 further comprising means for controlling selection of the divide ratio of said first mentioned counter means and at least one counter of said fixed counter means.

* * * * *